United States Patent [19]
Hsu et al.

[11] Patent Number: 5,610,087
[45] Date of Patent: Mar. 11, 1997

[54] METHOD FOR FABRICATING NARROW BASE WIDTH LATERAL BIPOLAR JUNCTION TRANSISTOR, ON SOI LAYER

[75] Inventors: Ching-Hsiang Hsu, Hsin Chu; Shyh-Chyi Wong, Taichang; Mong-Song Liang; Steve S. Chung, both of Hsinchu, all of Taiwan

[73] Assignee: Taiwan Semiconductor Manufacturing Company Ltd., Hsinchu, Taiwan

[21] Appl. No.: 565,202

[22] Filed: Nov. 9, 1995

[51] Int. Cl.$^6$ .................................. H01L 21/265
[52] U.S. Cl. ................ 437/32; 437/34; 437/59; 437/62; 148/DIG. 9
[58] Field of Search ................ 437/32, 34, 59, 437/62; 148/DIG. 9

[56] References Cited

U.S. PATENT DOCUMENTS

| | | | |
|---|---|---|---|
| 5,087,580 | 2/1992 | Eklund | 437/32 |
| 5,100,810 | 3/1992 | Yoshimi et al. | 437/32 |
| 5,164,326 | 11/1992 | Foerstner et al. | 437/59 |
| 5,185,280 | 2/1993 | Houston et al. | 437/44 |
| 5,273,915 | 12/1993 | Hwang et al. | 148/DIG. 9 |
| 5,294,821 | 3/1994 | Iwamastu | 257/351 |
| 5,406,102 | 4/1995 | Oashi | 437/52 |
| 5,426,062 | 6/1995 | Hwang | 437/34 |

*Primary Examiner*—Tuan H. Nguyen
*Attorney, Agent, or Firm*—George O. Saile

[57] ABSTRACT

A process has been developed in which narrow base width, lateral bipolar junction transistors, and short channel length MOSFET devices, can be simultaneously fabricated, in a silicon on insulator layer. The narrow base width is defined by the width of an insulator sidewall spacer, formed on the sides of a polysilicon gate structure. The narrow base width, resulting in increased transistor gain and switching speed, along with reductions in parasitic capacitances, due to placing devices in a silicon on insulator layer, result in enhanced device performance.

20 Claims, 4 Drawing Sheets

METHOD FOR FABRICATING NARROW BASE WIDTH LATERAL BIPOLAR JUNCTION TRANSISTOR, ON SOI LAYER

BACKGROUND OF THE INVENTION

(1) FIELD OF THE INVENTION

This invention relates to the fabrication of a semiconductor device, and more specifically to semiconductor devices fabricated from silicon on insulator, (SOI), technology.

(2) DESCRIPTION OF PRIOR ART

A major objective of the semiconductor industry has been to increase the performance of silicon devices while still maintaining, or decreasing the cost of manufacturing silicon devices or chips. These objectives are being partially realized by the ability of the semiconductor industry to achieve micro-miniaturization. The ability to produce silicon devices, with sub-micron features, has resulted in faster performing, and less costly silicon chips. Performance increases have been realized via decreased parasitic capacitances, and decreased resistances, as a result of the smaller device features. In addition smaller features, resulting in smaller silicon chips, allow more chips to be obtained from a specific diameter starting silicon wafer. Therefore for the identical cost of processing a wafer, a greater number of chips can be realized. Micro-miniaturazation has been achieved basically by rapid advances in several critical semiconductor fabrication disciplines. For example in the photolithographic discipline, more sophisticated exposure cameras, as well as more sensitive photoresist materials, have allowed sub-micron images in photoresist to be routinely achieved. In addition similar advances in the dry etching sector have allowed the sub-micron images in photoresist to be successfully transferred to underlying semiconductor materials, used in the fabrication sequence for semiconductor devices. However the approach of continually improving device performance via micro-miniaturazation, can be ultimately limited by the inability of the semiconductor fabrication disciplines to continue their rapid development of tools and materials.

Another approach used to increase device performance, via reductions in parasitic capacitances, is by the silicon on insulator, (SOI), technology. In this technology a thin layer of single crystalline silicon resides on an insulator, which in turn resides on a silicon substrate. The active device regions are created within the SOI layer, therefore unwanted junction capacitances, resulting in part from diffusion to substrate interfaces, are dramatically reduced. The advances in SOI technology have created opportunities for device designers, in regards to for both bipolar junction transistors, (BJT), as well as for metal oxide semiconductor field effect transistors, (MOSFET), devices. In addition semiconductor process sequences can be easily established, via use of the SOI technology, to integrate the BJT and MOSFET processes, to easily create a BiCMOS, (BJT—MOSFET), device. Prior art, such as Houston, et al, in U.S. Pat. No. 5,185,280, and Iwamatsu, et al, in U.S. Pat. No. 5,294,281, have described methods for fabricated integrated circuits using SOI. However these inventions do not show the specific techniques used to produce competitive, or high performing, BJT devices, that this invention will teach. This invention will describe a process sequence for fabricating lateral NPN bipolar junction devices, using SOI technology, with optimized device parameters, such as transistor gain, beta, as well as transistor switching speeds. It will be shown that the process sequences used to achieve this competitive BJT can also be used to simultaneously create MOSFET devices, thus offering a BiCMOS option.

SUMMARY OF THE INVENTION

It is an object of this invention to fabricate both bipolar junction transistors, as well as MOSFET devices, in a SOI layer.

It is another object of this invention to provide a process sequence which allows lateral bipolar junction transistors to be easily fabricated using process steps, similar to process steps used to create MOSFET devices.

It is yet another object of this invention to provide both lateral bipolar junction transistors and MOSFET devices with small parasitic capacitances, due to the use of SOI technology.

It is still yet another object of this invention to use an insulator sidewall spacer, created on the sides of a polysilicon gate structure, to define the base width of the lateral bipolar junction transistor.

In accordance with the present invention an N type, single crystalline silicon layer, is present on a silicon oxide layer, which in turn overlies a semiconductor substrate. Thick field oxide regions are thermally grown, for isolation purposes, followed by the growth of a thin silicon dioxide layer, to be used as the gate oxide for the MOSFET device. A polysilicon layer is chemically vapor deposited, doped via ion implantation procedures, and patterned to produce a polysilicon gate structure for the MOSFET device, while defining the collector region of the lateral bipolar junction transistor. The subsequent MOSFET region is then masked using photoresist processing, and the region of the lateral bipolar junction transistor, not covered by the polysilicon gate structure, is subjected to a P type, ion implantation process, to create a base region. After photoresist removal and solvent cleans, an insulator sidewall spacer is created on the sides of the polysilicon gate structures via deposition of, and anisotropic dry etching of, an insulator layer. The subsequent MOSFET region is again masked via photoresist processes, and a heavily doped N type, ion implantation procedure is applied to the region of the lateral bipolar junction transistor, not covered by the polysilicon gate structure, not covered by the insulator sidewall spacer, creating the emitter region, and defining the final base width of the bipolar device. After photoresist removal, and solvent cleans, another photoresist mask is used to allow a heavily doped P type, ion implantation procedure to be applied to regions of the MOSFET device, for purposes of creating source and drain areas, and to regions of the lateral bipolar junction transistor, for purposes of creating a contact area for the base region.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating a lateral bipolar junction transistor, with enhanced performance characteristics, via use of an insulator sidewall spacer, in addition to creating a MOSFET device, both in an SOI layer, will now be described in detail.

Figure 1:
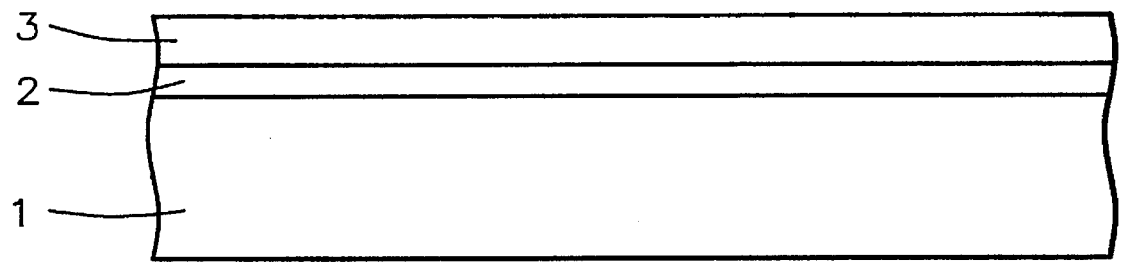
FIGS. 1–7, which schematically, in cross-sectional style, show the stages of fabrication used to create both lateral bipolar junction transistors, and MOSFET devices, in an SOI layer.

FIG. 1, shows a starting substrate, 1, with a silicon oxide layer, 2, and an overlying silicon on insulator layer, 3. The method used to obtain the silicon on insulator, (SOI), layer, is the SIMOX process, (Separation by IMplanted OXygen). This process results in a silicon on oxide layer, 3, consisting of P type silicon, with a <100> crystallographic orientation, to a thickness between about 1000 to 2000 Angstroms, and a resistivity between about 15 to 25 ohm—cm. The defect density of SOI layer, 3, is less than about 1E4 defects/$cm^2$. The underlying silicon oxide layer is between about 3000 to 4000 Angstroms. An N well is next created by subjecting the P type silicon layer, 3, to an ion implantation of phosphorous or arsenic at an energy between about 50 to 100 Kev., at a dose between about 5E12 to 5E14 atoms/$cm^2$.

Figure 2:
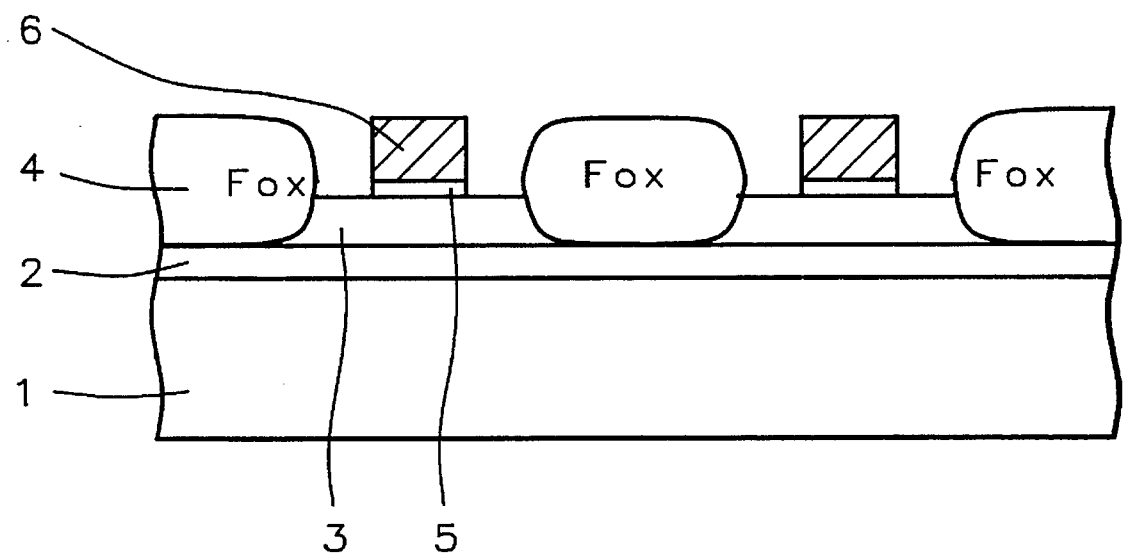

FIG. 2, next describes the creation of a thick, isolation, field oxide region, 4, (FOX), thermally grown using a silicon nitride—silicon dioxide composite, oxidation mask. The composite mask is patterned using standard photolithographic and reactive ion etching, (RE), procedures. The FOX regions, 4, are thermally grown, in unmasked areas, using an oxygen—steam ambient, to a thickness between about 2000 to 6000 Angstroms, at a temperature between about 900° to 1150° C. The thickness of the FOX region, 4, is designed to consume the entire thickness of the SOI layer, 3, in the areas not masked by the composite silicon nitride—silicon dioxide oxidation mask, to provide the required isolation. After removal of the oxidation mask composite, using hot phosphoric acid for silicon nitride, and a buffered hydrofluoric acid for the underlying silicon oxide layer, a thin silicon dioxide layer, 5, is thermally grown at a temperature between about 800° to 1000° C., to a thickness between about 40 to 80 Angstroms. The silicon dioxide layer, 5, will be used as the gate insulator for the subsequent MOSFET device. A polysilicon film is next deposited using low pressure chemical vapor deposition, (LPCVD), processing, at a temperature between about 500 to 650° C., to a thickness between about 1200 to 3000 Angstroms. The polysilicon layer can be deposited intrinsically and doped via ion implantation of phosphorous, at an energy between about 50 to 100 Kev., at a dose between about 1E14 to 1E16 atoms/$cm^2$. The polysilicon film can also be deposited using insitu doping procedures which include the addition of either phosphine or arsine to the silane ambient. Standard photolithographic and RIE procedures, using $Cl_2$ as an enchant, are employed to create polysilicon structure, 6, shown schematically in FIG. 2. The width of polysilicon structure, 6, between about 0.1 to 1.0 micrometers, will ultimately determine the channel length for the subsequent MOSFET device, and the N type collector region, for the lateral bipolar junction transistor.

Figure 3:
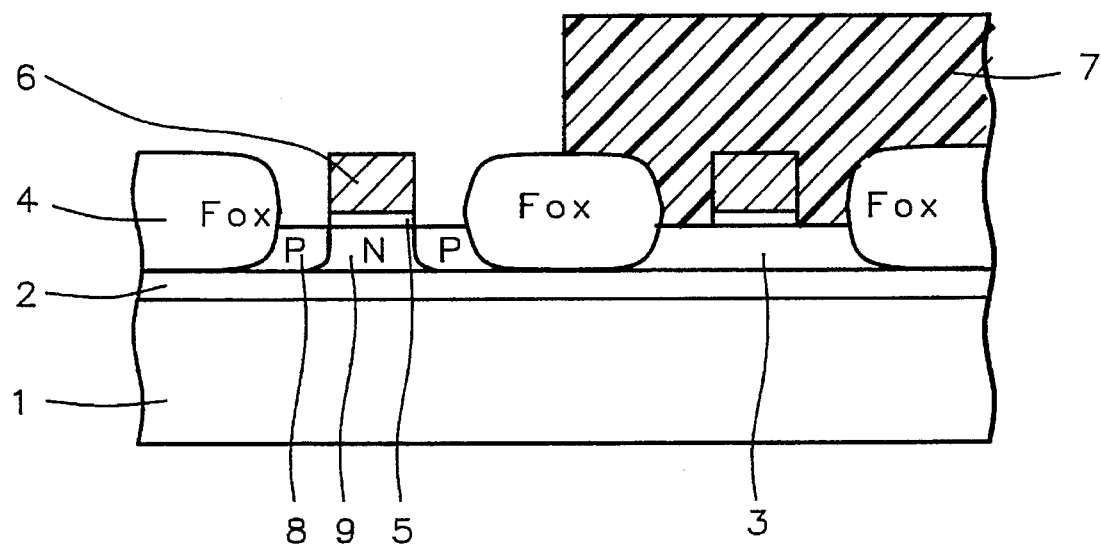
Figure 4:
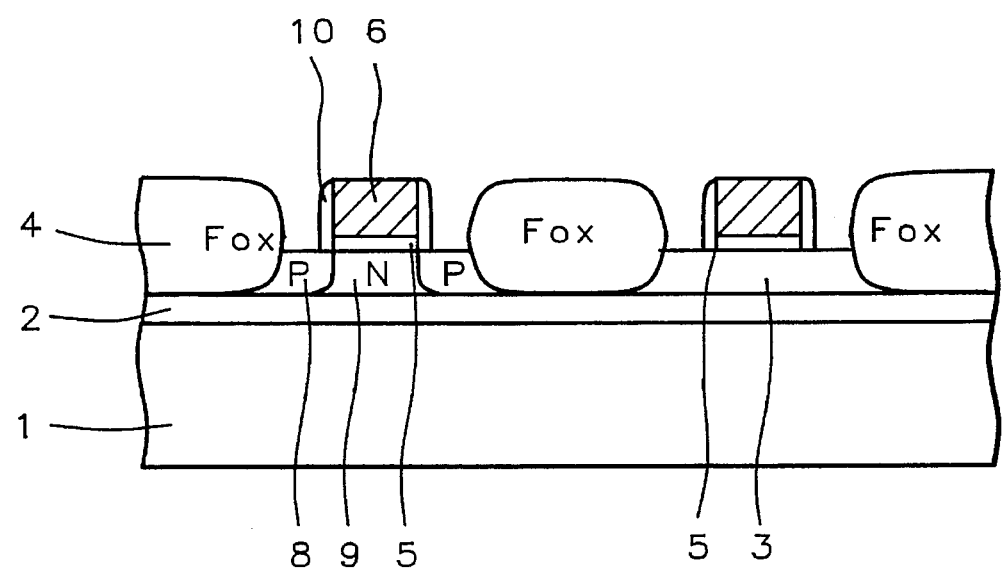

FIG. 3, shows the creation of the base region for the lateral bipolar junction transistor. Photolithographic procedures are employed to create photoresist mask, 7, used as a blockout for the subsequent MOSFET devices. An ion implantation of boron is performed at an energy between about 30 to 80 Kev., at a dose between about 1E12 to 1E14 atoms/$cm^2$, to create the initial base region, 8. This implantation step also results in the final definition of collector region, 9, of the lateral bipolar junction transistor. After photoresist removal, via plasma oxygen ashing, followed by careful wet solvent cleans, the insulator sidewall spacer, 10, is created for both the lateral bipolar junction transistor, as well as for the MOSFET device. The insulator sidewall spacer, 10, shown in FIG. 4, is created by initially depositing silicon oxide, using either LPCVD or plasma enhanced chemical vapor deposition, (PECVD), processing, at a temperature between about 600° to 800° C., to a thickness between about 800 to 2500 Angstroms. Next an anisotropic, RIE procedure, using $CHF_3$ as an etchant, is employed to create the spacer. The width of insulator sidewall spacer, 10, or thickness of the initial silicon oxide layer, is critical in determining the final base width of the lateral bipolar junction transistor.

Figure 5:
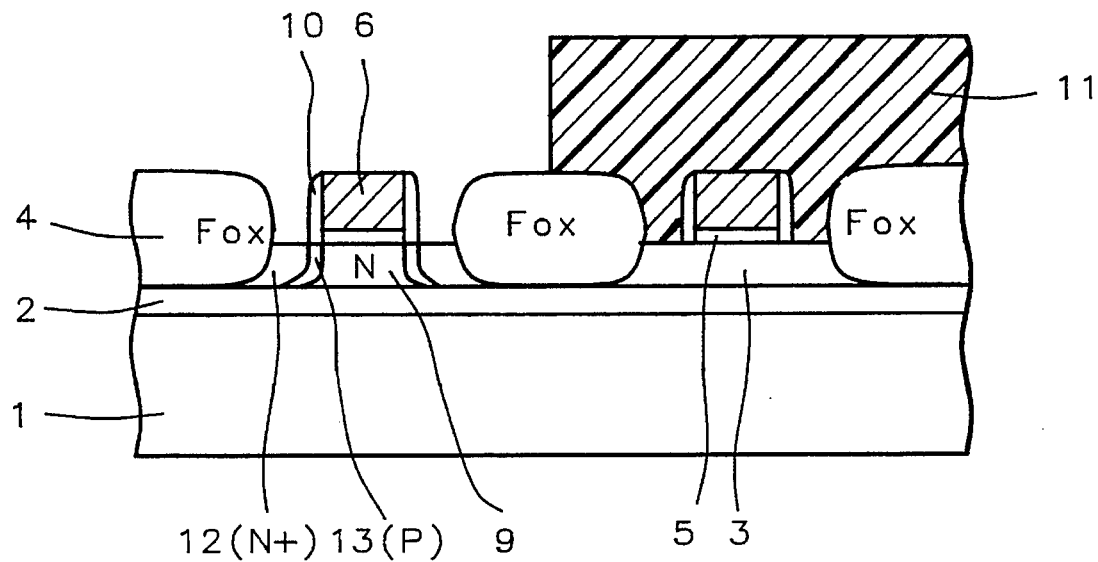

Photolithographic procedures are again used to block out subsequent MOSFET regions with photoresist mask, 11. An ion implantation step, using arsenic at an energy between about 30 to 80 Kev., at a dose between about 1E14 to 1E16 atoms/$cm^2$, is used to create emitter regions, 12, for the lateral bipolar junction transistor, shown schematically in FIG. 5. This implantation procedure also determines the final base width, 13, of the lateral bipolar junction transistor. A major objective of this invention is to create competitive bipolar devices in terms of transistor gain, as well transistor switching speed. These transistor characteristics are positively influenced by decreasing base widths. Therefore the ability to create narrow insulator sidewall spacers translates into narrow base widths, resulting in enhanced device performance in terms of transistor gain, beta, as well as enhanced transistor switching speeds. The combination of creating fast bipolar junction transistors, along with the reduced parasitic capacitances, realized via the use of SOI technology, results in enhanced device performance.

Figure 6:
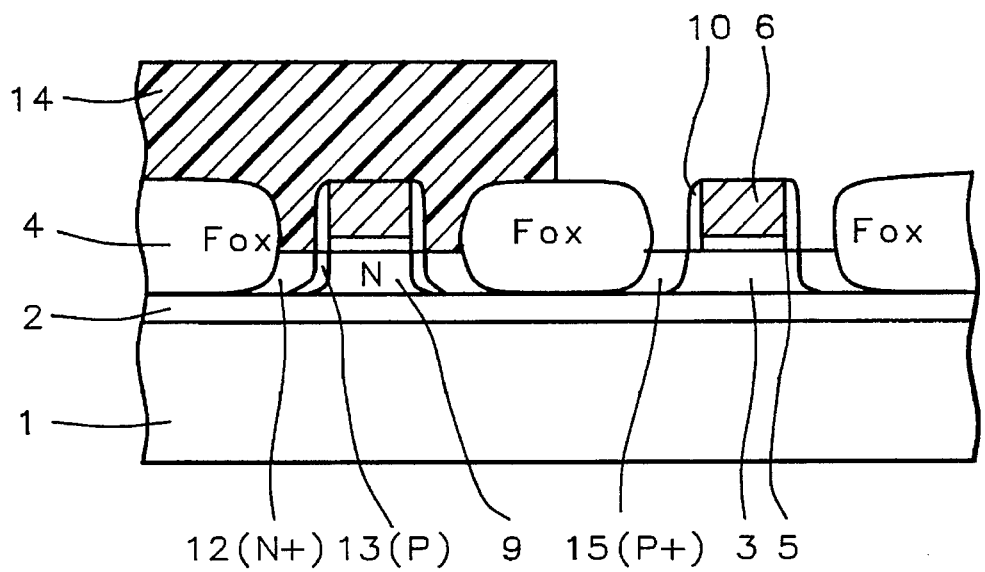

Removal of photoresist blockout mask, 11, is accomplished via plasma oxygen ashing, followed by careful wet solvent cleans. Another photoresist mask, 14, is used to allow a heavily doped P type ion implantation of boron, at an energy between about 30 to 80 Kev., at a dose between about 1E14 to 1E16 atoms/$cm^2$, to be used to create the source and drain regions, 15, of the MOSFET device. This is shown schematically in FIG. 6. The photoresist mask, 14, is also used to allow a portion of the base region, 8, to receive the heavily doped P type implantation, for purposes of improving base contact resistance to subsequent overlying metallizations. This is not shown in FIG. 6.

Figure 7:
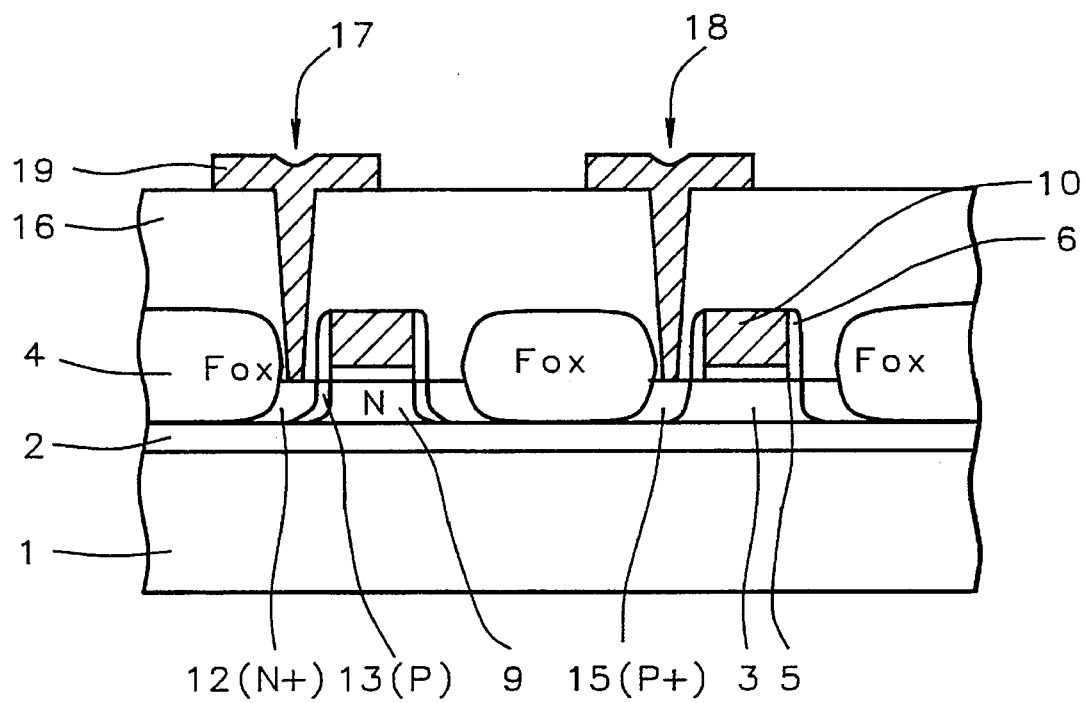
Figure 8:
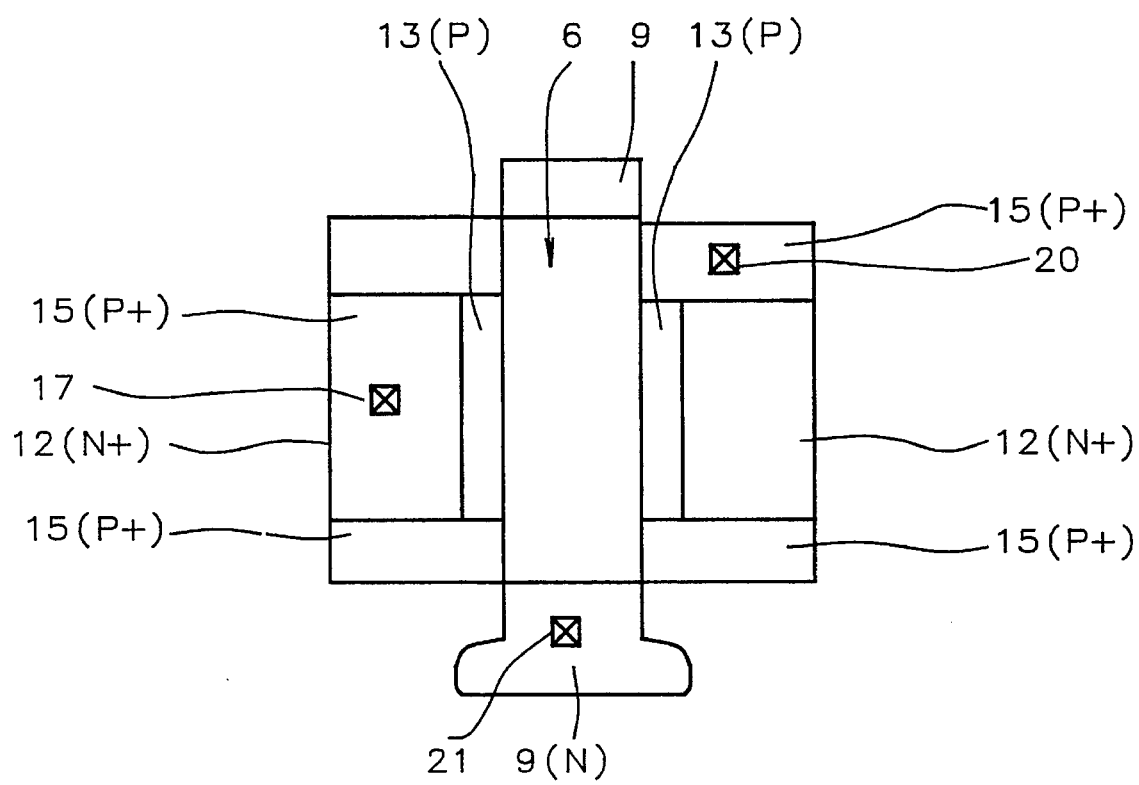
FIG. 8, which shows the top view of a lateral bipolar junction transistor, created in an SOI layer.

Photoresist mask, 14, is removed via plasma oxygen ashing, and careful wet solvent cleans, followed by the deposition of silicon oxide layer, 16, obtained using PECVD processing at a temperature between about 300° to 450° C., to a thickness between about 5000 to 7000 Angstroms. FIG. 7, shows the creation of contact holes, 17, to the emitter region, 12, and to source and drain region, 18. Contact holes to the collector region, 9, the base region, 8, of the lateral bipolar junction transistor, as well as contact holes to polysilicon gate structure, 6, of the MOSFET device, are made, however not shown in FIG. 7. The contact holes are created using conventional photolithographic, and RIE processing, using a $CHF_3$ etch chemistry. After photoresist removal, via plasma oxygen ashing, followed by careful wet cleans, a deposition of an aluminum based metallurgy is made to a thickness between about 4000 to 6000 Angstroms. Again standard photolithographic and RIE procedures, using a $C_2$ etch chemistry, are used to produce metal structure, 19, shown schematically in FIG. 7. Photoresist is again removed using plasma oxygen ashing processing, followed by careful wet solvent cleans. FIG. 8, shows the top view of the lateral bipolar junction transistor. A contact, 20, to base region, 8, and a contact, 21, to collector region, 9, is also included.

Although this process for fabricating enhanced lateral bipolar junction transistors, along with MOSFET devices, has been shown using a P channel MOSFET device, applications can be accommodated to easily include N channel MOSFET devices, to achieve BiCMOS designs.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating silicon devices in a layer of silicon on insulator, on a semiconductor substrate, comprising the steps of:

providing said semiconductor substrate;

providing said silicon on insulator layer, on said semiconductor substrate;

growing field oxide regions on specific areas of said silicon on insulator layer;

growing a first insulator layer on surface of said silicon on insulator layer, not covered by said field oxide regions;

depositing a polysilicon layer on said first insulator layer and on said field oxide regions;

ion implanting a first conductivity imparting dopant into said polysilicon layer;

patterning of said polysilicon layer to form polysilicon gate structure;

first photoresist masking to expose only a first specific region of said silicon on insulator layer;

ion implanting a second conductivity imparting dopant into said first specific region of silicon on insulator layer, not covered by said first photoresist masking, not covered by said field oxide regions, and not covered by said polysilicon gate structure;

removal of said first photoresist masking;

deposition of a second insulator layer;

anisotropic etching of said second insulator layer to form insulator sidewall spacer on sides of said polysilicon gate structure;

second photoresist masking to expose only the said first specific region of said silicon on insulator layer;

ion implanting a third conductivity imparting dopant into said first specific region of silicon on insulator layer, not covered by said second photoresist masking, not covered by said field oxide region, not covered by said polysilicon gate structure, and not covered by said insulator sidewall spacer;

removal of said second photoresist masking;

third photoresist masking to expose only a second specific region of said silicon on insulator layer;

ion implanting a fourth conductivity imparting dopant into said second specific region of said silicon on insulator layer, not covered by said third photoresist masking, not covered by said field oxide regions, not covered by said polysilicon gate structure, and not covered by said insulator sidewall spacer;

removal of said third photoresist masking;

deposition of a third insulator layer;

opening contact holes in said third insulator layer, to said first specific region, and to said second specific region of said silicon on insulator layer;

deposition of a metal; and forming metal contact structures to said first specific region, and to said second specific region of said silicon on insulator layer.

2. The method of claim 1, wherein said silicon on insulator layer is produced by the SIMOX process, resulting in a P type silicon layer, having a <100> crystallographic orientation, with a resistivity between about 15 to 25 ohm—cm, and a thickness between about 500 to 2000 Angstroms.

3. The method of claim 1, wherein said first insulator layer is silicon dioxide, thermally grown, in a oxygen—steam ambient, at a temperature between about 800° to 1000° C., to a thickness between about 40 to 200 Angstroms.

4. The method of claim 1, wherein said polysilicon layer is deposited intrinsically, using LPCVD processing, at a temperature between about 500° to 650° C., to a thickness between about 1200 to 3000 Angstroms.

5. The method of claim 1, wherein said first conductivity imparting dopant is phosphorous, ion implanted at an energy between about 50 to 100 Kev., at a dose between about 1E14 to 1E16 atoms/cm$^2$.

6. The method of claim 1, wherein said second conductivity imparting dopant is boron, ion implanted at an energy between about 30 to 80 Kev., at a dose between about 1E12 to 1E14 atoms/cm$^2$.

7. The method of claim 1, wherein said second insulator layer is silicon oxide, deposited using either LPCVD or PECVD processing, at a temperature between about 600° to 800° C., to thickness between about 800 to 2500 Angstroms.

8. The method of claim 1, wherein said insulator sidewall spacer is formed by anisotropic RIE processing, using $CHF_3$ as an etchant.

9. The method of claim 1, wherein said third conductivity imparting dopant is arsenic, ion implanted at an energy between about 30 to 80 Kev., at a dose between about 1E14 to 1E16 atoms/cm$^2$.

10. The method of claim 1, wherein said fourth conductivity imparting dopant is boron, ion implanted at an energy between about 30 to 80 Kev., at a dose between about 1E14 to 1E16 atoms/cm$^2$.

11. A method for fabricating lateral bipolar junction transistors and MOSFET devices, in a layer of silicon on insulator, on a semiconductor substrate, comprising the steps of:

providing said semiconductor substrate;

providing said silicon on insulator layer, on said semiconductor substrate;

growing field oxide regions on specific areas of said silicon on insulator layer;

growing a first insulator layer on surface of said silicon on insulator layer, not covered by said field oxide regions;

depositing a polysilicon layer on said first insulator layer and on said field oxide regions;

ion implanting a first conductivity imparting dopant into said polysilicon layer;

patterning of said polysilicon layer to form polysilicon gate structure;

first photoresist masking to expose a first specific region of said silicon on insulator layer, to be used for said lateral bipolar junction transistor;

ion implanting a second conductivity imparting dopant into said first specific region of said silicon on insulator layer, not covered by said first photoresist masking, not covered by said field oxide regions, and not covered by said polysilicon gate structure, to be used for base region of said lateral bipolar junction transistor and simultaneously forming a collector region;

removal of said first photoresist masking;

deposition of a second insulator layer;

anisotropic etching of said second insulator layer to form insulator sidewall spacer on sides of said polysilicon gate structure;

second photoresist masking to expose said first specific region of said silicon on insulator layer, to be used for said lateral bipolar junction transistor;

ion implanting a third conductivity imparting dopant into said first specific region of said silicon on insulator layer, not covered by said second photoresist masking, not covered by said field oxide regions, not covered by said polysilicon gate structure, and not covered by said insulator sidewall spacer, to form emitter region of said lateral bipolar junction transistor;

removal of said second photoresist masking;

third photoresist masking to expose a second specific region of said silicon on insulator layer, to be used for said MOSFET device;

ion implanting a fourth conductivity imparting dopant into said second specific region of said silicon on insulator layer, not covered by said third photoresist masking, not covered by said field oxide regions, not covered by said polysilicon gate structure, and not covered by said insulator sidewall spacer, to form source and drain regions of said MOSFET device;

deposition of a third insulator layer;

opening contact holes to said emitter region, to said base region, and to said collector region, of said lateral bipolar junction transistor, and opening contact holes to said source and drain regions, and to said polysilicon gate structure, of said MOSFET device;

deposition of a metal; and forming metal contact structures to said emitter region, to said base region, and to said collector region, of said lateral bipolar junction transistor, and to said source and drain regions, and to said polysilicon gate structure, of said MOSFET device.

12. The method of claim 11, wherein said silicon on insulator layer is obtained via the SIMOX process, resulting in a P type silicon layer, having an <100> crystallographic orientation, with a resistivity between about 15 to 25 ohm—cm, and a thickness between about 500 to 2000 Angstroms.

13. The method of claim 11, wherein said first insulator layer is silicon dioxide, thermally grown in an oxygen steam ambient, at a temperature between about 800° to 1000° C., to a thickness between about 40 to 200 Angstroms.

14. The method of claim 11, wherein said polysilicon layer is deposited using LPCVD processing, at a temperature between about 500° to 650° C., to a thickness between about 1200 to 3000 Angstroms.

15. The method of claim 11, wherein said first conductivity imparting dopant is phosphorous, ion implanted at an energy between about 50 to 100 Kev., at a dose between about 1E14 to 1E16 atoms/cm$^2$.

16. The method of claim 11, wherein said second conductivity imparting dopant, used to form said base region of said lateral bipolar junction transistor, is boron, ion implanted at an energy between about 30 to 80 Kev., at a dose between about 1E12 to 1E14 atoms/cm$^2$.

17. The method of claim 11, wherein said second insulator layer is silicon oxide, deposited using either LPCVD or PECVD processing, at a temperature between about 600° to 800° C., to thickness between about 800 to 2500 Angstrom.

18. The method of claim 11, wherein said insulator sidewall spacer is formed via anisotropic, reactive ion etching, using $CHF_3$ as an etchant.

19. The method of claim 11, wherein said third conductivity imparting dopant, used to form said emitter region, and used to define final width of said base region, of said lateral bipolar junction transistor, is arsenic, ion implanted at an energy between about 30 to 80 Kev., at a dose between about 1E14 to 1E16 atoms/c$^2$.

20. The method of claim 11, wherein said fourth conductivity imparting dopant, used to form said source and drain regions of said MOSFET device, is boron, ion implanted at an energy between about 30 to 80 Kev., at a dose between about 1E14 to 1E16 atoms/c$^2$.

* * * * *